(12) United States Patent
de Groot et al.

(10) Patent No.: US 9,140,537 B2
(45) Date of Patent: Sep. 22, 2015

(54) INTERFEROMETRIC HETERODYNE OPTICAL ENCODER SYSTEM

(71) Applicant: Zygo Corporation, Middlefield, CT (US)

(72) Inventors: Peter J. de Groot, Middletown, CT (US); Michael Schroeder, East Hampton, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 14/521,816

(22) Filed: Oct. 23, 2014

(65) Prior Publication Data

US 2015/0043005 A1  Feb. 12, 2015

Related U.S. Application Data

(63) Continuation of application No. 13/361,492, filed on Jan. 30, 2012, now Pat. No. 8,885,172.

(60) Provisional application No. 61/438,394, filed on Feb. 1, 2011.

(51) Int. Cl.
*G01B 9/02* (2006.01)
*G01B 11/02* (2006.01)
(Continued)

(52) U.S. Cl.
CPC ........ *G01B 9/02059* (2013.01); *G01B 9/02003* (2013.01); *G01B 9/02007* (2013.01);
(Continued)

(58) Field of Classification Search
CPC ........... G01B 9/02059; G01B 2290/70; G01B 9/02055; G01D 5/266; G01D 5/34723; G01D 5/34746

USPC .................................................. 356/499, 521
See application file for complete search history.

(56) References Cited

U.S. PATENT DOCUMENTS 4,436,424 A   3/1984  Bunkenburg
4,629,886 A  12/1986  Akiyama et al.
(Continued)

FOREIGN PATENT DOCUMENTS

JP   63-38102   2/1988
JP   5-126603   5/1993
(Continued)

OTHER PUBLICATIONS

Youichi Bitou, "Polarization Mixing Error Reduction in a Two-Beam Interferometer", *Optical Review*, vol. 9, No. 5, pp. 227-229 (2002).
(Continued)

*Primary Examiner* — Michael A Lyons
*Assistant Examiner* — Hina F Ayub
(74) *Attorney, Agent, or Firm* — Fish & Richardson P.C.

(57) ABSTRACT

An encoder interferometry system includes a beam splitting element positioned to receive an input beam from a light source, in which the beam splitting element is configured to direct a first portion of the input beam along a measurement path to define a measurement beam and a second portion of the input beam along a reference path to define a reference beam, an encoder scale positioned to diffract the measurement beam at least once, one or more optical components configured and arranged to alter a direction of a first diffracted portion of the measurement beam and a direction of a second diffracted portion of the measurement beam such that beam paths of the first diffracted portion and the second diffracted portion are non-parallel subsequent to the first diffracted portion and the second diffracted portion passing through the beam splitting element, and a detector positioned to receive the first diffracted portion.

13 Claims, 11 Drawing Sheets

(51) Int. Cl.
*G01D 5/347* (2006.01)
*G03F 7/20* (2006.01)
*G01D 5/26* (2006.01)

(52) U.S. Cl.
CPC ............ *G01B9/02076* (2013.01); *G01D 5/266* (2013.01); *G01D 5/347* (2013.01); *G01D 5/34723* (2013.01); *G03F 7/70775* (2013.01); *G01B 2290/15* (2013.01); *G01B 2290/70* (2013.01)

(56) References Cited

U.S. PATENT DOCUMENTS

| | | | |
|---|---|---|---|
| 4,676,645 | A | 6/1987 | Taniguchi et al. |
| 4,728,193 | A | 3/1988 | Bartelt et al. |
| 4,930,895 | A | 6/1990 | Nishimura et al. |
| 4,979,826 | A | 12/1990 | Ishizuka et al. |
| 5,000,573 | A | 3/1991 | Suzuki et al. |
| 5,035,507 | A | 7/1991 | Nishioki et al. |
| 5,118,932 | A | 6/1992 | Brownrigg et al. |
| 5,430,546 | A | 7/1995 | Huber |
| 5,663,793 | A | 9/1997 | de Groot |
| 5,818,588 | A | 10/1998 | Matsumoto et al. |
| 6,201,609 | B1 | 3/2001 | Hill et al. |
| 6,407,815 | B2 | 6/2002 | Akihiro |
| 6,469,793 | B1 | 10/2002 | Stanton |
| 6,778,280 | B2 | 8/2004 | De Groot et al. |
| 6,897,961 | B2 | 5/2005 | Muenter et al. |
| 7,009,709 | B2 * | 3/2006 | Law et al. .................... 356/484 |
| 7,019,842 | B2 | 3/2006 | Holzapfel et al. |
| 7,126,696 | B2 | 10/2006 | Tobiason |
| 7,154,609 | B2 | 12/2006 | Holzapfel et al. |
| 7,193,204 | B2 | 3/2007 | Mitchell |
| 7,426,037 | B2 | 9/2008 | Ostrovsky et al. |
| 7,440,113 | B2 | 10/2008 | Trutna, Jr. et al. |
| 7,471,397 | B2 | 12/2008 | Holzapfel |
| 7,502,122 | B2 | 3/2009 | Tobiason et al. |
| 7,573,581 | B2 | 8/2009 | Holzapfel |
| 7,636,165 | B2 | 12/2009 | Klaver et al. |
| 8,300,233 | B2 | 10/2012 | Deck et al. |
| 2006/0055937 | A1 | 3/2006 | Lai et al. |
| 2007/0223005 | A1 | 9/2007 | Lee |
| 2008/0165345 | A1 | 7/2008 | Hill |
| 2009/0109442 | A1 * | 4/2009 | Felix .......................... 356/491 |
| 2009/0268210 | A1 | 10/2009 | Prince |
| 2010/0079767 | A1 | 4/2010 | Ishizuka |
| 2010/0315648 | A1 | 12/2010 | Sternberg et al. |
| 2011/0075153 | A1 | 3/2011 | Hogan |
| 2011/0255096 | A1 | 10/2011 | Deck et al. |
| 2012/0154780 | A1 | 6/2012 | Demarest |

FOREIGN PATENT DOCUMENTS

| | | |
|---|---|---|
| JP | 7-167606 | 7/1995 |
| JP | 8-5314 | 1/1996 |
| JP | 2004-534230 | 11/2004 |
| WO | WO 01/16557 | 3/2001 |
| WO | WO 03/004966 | 1/2003 |

OTHER PUBLICATIONS

M. Neviere et. al., "High accuracy translation rotation encoder with two gratings in a Littrow mount," Appl. Opt. 38(1): 67-76 (1999).

J. Partanen, "Multipass grating interferometer applied to line narrowing in excimer lasers," Appl. Opt., 25(21):3810-3815 (1986).

Chyan-Chyi Wu et al., "Optical heterodyne laser encoder with sub-nanometer resolution", Measurement Science and Technology 19:1-8 (2008).

International Search Report for PCT/US2012/023126 dated Sep. 28, 2012.

Japanese Office Action for Application No. 2013-551410 dated Jul. 1, 2015 (9 pages).

* cited by examiner

Pattern on detector: Non-collinear

Pattern on detector: Collinear

INTERFEROMETRIC HETERODYNE OPTICAL ENCODER SYSTEM

CROSS-REFERENCE TO RELATED APPLICATIONS

Pursuant to 35 U.S.C. 120, this application is a continuation of and claims priority to U.S. application Ser. No. 13/361,492, filed on Jan. 30, 2012, which claims priority to Provisional Application No. 61/438,394, filed on Feb. 1, 2011, the contents of which are hereby incorporated by reference in their entirety.

TECHNICAL FIELD

This disclosure relates to interferometric heterodyne optical encoder systems and methods to implement a heterodyne measurement of phase changes occurring in reflected or transmitted beams diffracted from an encoder scale.

BACKGROUND

In some cases, interferometric measuring systems monitor changes in the relative position of a measurement object based on an optical interference signal. For example, an interferometer generates the optical interference signal by overlapping and interfering a "measurement beam" that interacts with (e.g., reflects from) the measurement object with a second beam, sometimes called a "reference beam." Changes in the relative position of the measurement object correspond to changes in the phase of the measured optical interference signal.

However, many interferometric measuring systems include nonlinearities such as what are known as "cyclic errors." In general, cyclic errors are understood as measurement errors that are periodic with the relative position of a measurement object. The cyclic errors can be expressed as contributions to the phase and/or the intensity of the measured interference signal and have a sinusoidal dependence on the change in an optical path difference between the measurement beam and the second beam. The cyclic errors can be produced by "beam mixing," in which a portion of an input beam that nominally forms the second beam propagates along a measurement path and/or a portion of an input beam intended to propagate along the measurement path instead propagates along a reference path. Such beam mixing can be caused by ellipticity in the polarizations of the input beam and/or imperfections in the interferometer components. Cyclic errors can also be produced by imperfections in components such as retro-reflectors and/or phase retardation plates that produce undesired ellipticities in beams in the interferometer. If not compensated, the foregoing cyclic errors can limit the accuracy of position changes measured by the interferometer system.

SUMMARY

This disclosure relates to interferometric heterodyne optical encoder systems and methods to implement a measurement of phase changes occurring in reflected or transmitted beams diffracted from an encoder scale. In a preferred embodiment, an encoder system includes an output component positioned to deflect spurious beams away from a detector, and thus reduce the magnitude of cyclic errors produced by ghost beams and/or polarization mixing effects.

In certain aspects, the disclosure features an encoder system including an interferometer positioned to receive first and second beams having different frequencies, in which the interferometer has at least one polarizing beam splitting element for directing the first beam along a measurement path to define a measurement beam and the second beam along a reference path to define a reference beam. The encoder system further includes an encoder scale positioned to diffract the measurement beam at least once, a detector positioned to receive the measurement and reference beams after the measurement beam diffracts from the encoder scale, and an output component positioned to receive the measurement and reference beams before they reach the detector and deflect spurious portions of the first and second beam away from the detector. The spurious portions include a portion of the first beam directed along the reference path and a portion of the second beam directed along the measurement path because of imperfections in any of a polarization of the first beam, a polarization of the second beam, and the polarizing beam splitting element.

Implementations of the encoder system can include one or more of the following features and/or features of other aspects. For example, the output component can be a birefringent output component. The output birefringent component can include a prism pair. A first prism in the prism pair can include a birefringent wedge and a second prism in the prism pair can include a glass wedge.

In some implementations, the system further includes a linear polarizer, an output fiber-optic lens, and output fiber to couple the measurement and reference beams from the output component to the detector. The input fiber-optic lens and the input component can be combined to cause the angular difference in propagation direction between the first and second beams to be between about 0.1 and 10 mrad or between about 0.5 and 5 mrad.

In some implementations, the system further includes a source configured to generate the first and second beams having the different frequencies, wherein the source is further configured to cause the first and second beam to have substantially orthogonal polarizations. The source can include an acousto-optic modulator, an electro-optic modulator, or a Zeeman-split laser to generate the different frequencies. The source can include an input component to introduce an angular difference in propagation direction between the first and second beams. The source can be configured to cause both the first and second beams to have a linear polarization, a circular polarization or an elliptical polarization.

The input component can be a birefringent input component. The input component can include a prism pair. The source can further include a pair of input polarization-preserving fibers for carrying the first and second beams toward the interferometer, and an input fiber-optic lens for coupling the first and second beams from the input fibers to the input component. The input and output components can correspond to different portions of a common birefringent component.

In some implementations, the output component is further configured to combine the measurement and reference beams with one another.

In some implementations, the detector is configured to measure an interferometric intensity signal based on interference between the measurement beam and the reference beam.

In some implementations, the encoder scale comprises a one-dimensional grating.

In some implementations, the interferometer includes a measurement retroreflector, in which the encoder scale diffracts the measurement beam to the measurement retroreflector, receives the measurement beam back from the measurement retroreflector, and then diffracts the measurement beam back to the polarizing beam splitting element. The interferometer can have a polarizing beam splitter that includes the polarizing beam splitting element. The interferometer can further include a reference retroreflector for retroreflecting the reference beam back to the polarizing beam splitting element.

In some implementations, the first and second beams define a first set of input beams, in which the interferometer is further positioned to receive a second set of input beams to define a second measurement beam and a second reference beam. The encoder scale can be positioned to diffract the second measurement beam at least once, and the system can further include a second detector positioned to receive the second measurement and reference beams after the second measurement beam diffracts from the encoder scale. The system can further include a second output component positioned to receive the second measurement and reference beams before they reach the second detector and deflect spurious portions of the second set of input beams away from the second detector. The interferometer can further include a second measurement retroreflector, wherein the encoder scale diffracts the second measurement beam to the second measurement retroreflector, receives the second measurement beam back from the second measurement retroreflector, and then diffracts the second measurement beam back to the polarizing beam splitting element. The second detector can be configured to measure a second interferometric intensity signal based on interference between the second measurement beam and the second reference beam. The system can further include a signal processing system to determine changes in the position of the encoder scale along at least two degrees of freedom based on the first and second interferometric intensity signals.

In some implementations, the first and second beams have an angular difference in propagation prior to impinging on the polarizing beam splitting element. For example, the angular difference in propagation can be between about 0.1 and 10 mrad or the angular difference in propagation can be between about 0.5 and 5 mrad.

In some implementations, the beam splitting element includes a beam splitting interface. The beam splitting element can be a prism cube, a diffractive optical element, or a birefringent element.

The details of one or more embodiments are set forth in the accompanying drawings and the description below. Other features and advantages will be apparent from the description, the drawings, and from the claims.

DETAILED DESCRIPTION

The present disclosure is directed towards error compensation in interferometric heterodyne optical encoder systems. The disclosure below is organized into three sections. A first section of the disclosure, entitled "Interferometric Heterodyne Optical Encoder Systems," relates to a general description of how an interferometric heterodyne optical encoder system may operate. A second section of the disclosure, entitled "Angled-Beam Error Correction," relates to structures and methods for correcting errors in interferometric heterodyne optical encoder systems. A third section of the disclosure entitled, "Lithography Tool Applications," relates to structures and methods for employing the interferometric heterodyne optical encoder system in a lithography system.

Interferometric Heterodyne Optical Encoder Systems

Figure 1:
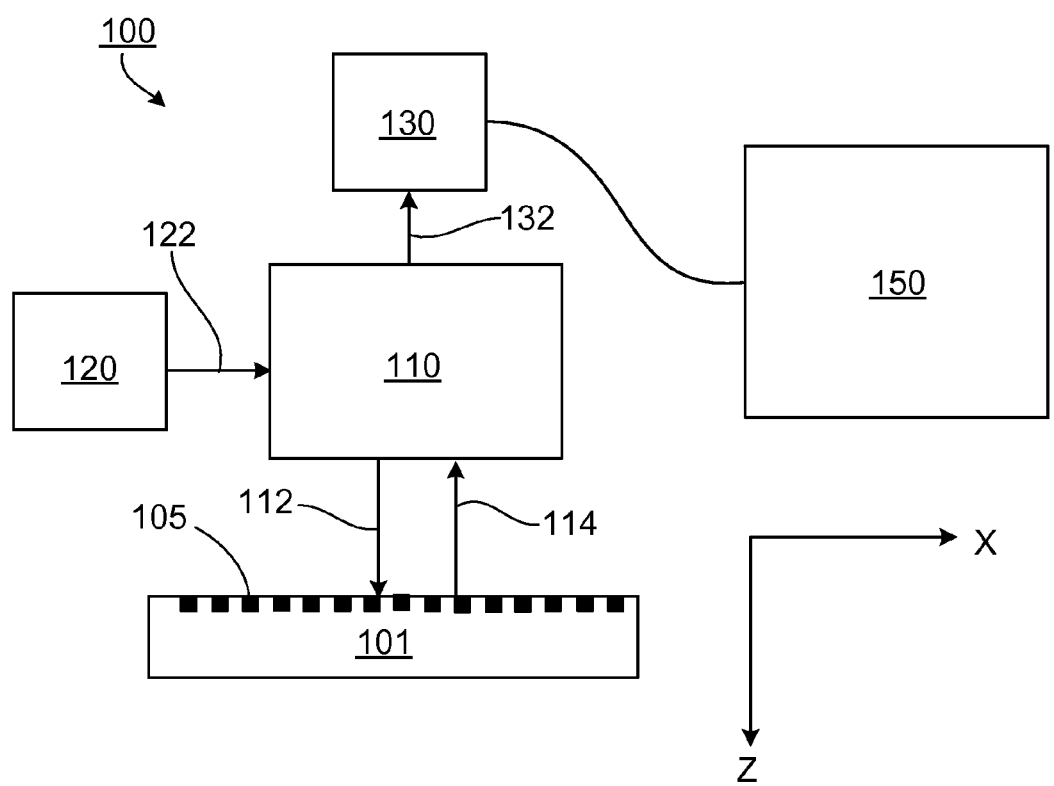
FIG. 1 is a schematic diagram of an embodiment of an interferometric heterodyne optical encoder system.

Referring to FIG. 1, an example of an interferometric heterodyne optical encoder system 100 includes a light source module 120 (e.g., including a laser), an optical assembly 110, a measurement object 101, a detector module 130 (e.g., including a polarizer and a detector), and an electronic processor 150. Generally, light source module 120 includes a light source and can also include other components such as beam shaping optics (e.g., light collimating optics), light guiding components (e.g., fiber optic waveguides) and/or polarization management optics (e.g., polarizers and/or wave plates). Various embodiments of optical assembly 110 are described below. The optical assembly is also referred to as the "encoder head." A Cartesian coordinate system is shown for reference.

Measurement object 101 is positioned some nominal distance from optical assembly 110 along the Z-axis. In many applications, such as where the encoder system is used to monitor the position of a wafer stage or reticle stage in a lithography tool, measurement object 101 is moved relative to the optical assembly in the X- and/or Y-directions while remaining nominally a constant distance from the optical assembly relative to the Z-axis. This constant distance can be relatively small (e.g., a few centimeters or less). However, in such applications, the location of measurement object typically will vary a small amount from the nominally constant distance and the relative orientation of the measurement object within the Cartesian coordinate system can vary by small amounts too. During operation, encoder system 100 monitors one or more of these degrees of freedom of measurement object 101 with respect to optical assembly 110, including a position of measurement object 101 with respect to the x-axis, and further including, in certain embodiments, a position of the measurement object 101 with respect to the y-axis and/or z-axis and/or with respect to pitch and yaw angular orientations. In some embodiments, the optical assembly can be moved with respect to the measurement object 101, whereas in some other embodiments, both the measurement object 101 and the optical assembly are moveable.

To monitor the position of measurement object 101, source module 120 directs an input beam 122 to optical assembly 110. Optical assembly 110 derives a measurement beam 112 from input beam 122 and directs measurement beam 112 to measurement object 101. Optical assembly 110 also derives a reference beam (not shown) from input beam 122 and directs the reference beam along a path different from the measurement beam. For example, optical assembly 110 can include a beam splitter that splits input beam 122 into measurement beam 112 and the reference beam. The measurement and reference beams can have orthogonal polarizations (e.g., orthogonal linear polarizations).

Measurement object 101 includes an encoder scale 105, which is a measuring graduation that diffracts the measurement beam from the encoder head into one or more diffracted orders. In general, encoder scales can include a variety of different diffractive structures such as gratings or holographic diffractive structures. Examples or gratings include sinusoidal, rectangular, or saw-tooth gratings. Gratings can be characterized by a periodic structure having a constant pitch, but also by more complex periodic structures (e.g., chirped gratings). In general, the encoder scale can diffract the measurement beam into more than one plane. For example, the encoder scale can be a two-dimensional grating that diffracts the measurement beam into diffracted orders in the X-Z and Y-Z planes. The encoder scale extends in the X-Y plane over distances that correspond to the range of the motion of measurement object 110.

In the present embodiment, encoder scale 105 is a grating having grating lines that extend orthogonal to the plane of the page, parallel to the Y-axis of the Cartesian coordinate system shown in FIG. 1. The grating lines are periodic along the X-axis. Encoder scale 105 has a grating plane corresponding to the X-Y plane and the encoder scale diffracts measurement beam 112 into one or more diffracted orders in the Y-Z plane.

At least one of these diffracted orders of the measurement beam (labeled beam 114), returns to optical assembly 110, where it is combined with the reference beam to form an output beam 132. For example, the once-diffracted measurement beam 114 can be the first-order diffracted beam.

Output beam 132 includes phase information related to the optical path length difference between the measurement beam and the reference beam. Optical assembly 110 directs output beam 132 to detector module 130 that detects the output beam and sends a signal to electronic processor 150 in response to the detected output beam. Electronic processor 150 receives and analyzes the signal and determines information about one or more degrees of freedom of measurement object 101 relative to optical assembly 110.

In certain embodiments, the measurement and reference beams have a small difference in frequency (e.g., a difference in the kHz to MHz range) to produce an interferometry signal of interest at a frequency generally corresponding to this frequency difference. This frequency is hereinafter referred to interchangeably as the "heterodyne" frequency or the "reference" frequency, and is denoted as (OR (with respect to angular frequency). Information about the changes in the relative position of the measurement object generally corresponds to a phase of the interferometry signal at this heterodyne frequency. Signal processing techniques can be used to extract this phase. In general, the moveable measurement object causes this phase term to be time-varying. In this regard, the first order time derivative of the measurement object movement causes the frequency of the interferometry signal to shift from the heterodyne frequency by an amount referred to herein as the "Doppler" shift.

The different frequencies of the measurement and reference beams can be produced, for example, by laser Zeeman splitting, by acousto-optical modulation, using two different laser modes, or internal to the laser using birefringent elements, among other techniques. The orthogonal polarizations allow a polarizing beam-splitter to direct the measurement and reference beams along different paths, and combine them to form the output beam that subsequently passes through a polarizer, which mixes the orthogonally polarized components so they can interfere. In the absence of target motion the interference signal oscillates at the heterodyne frequency, which is just the difference in the optical frequencies of the two components. In the presence of motion the heterodyne frequency incurs a change related to the velocity of the target through well-known Doppler relations. Accordingly, monitoring changes in the heterodyne frequency allows one to monitor motion of the target relative to the optical assembly.

In the embodiments described below, the "input beam" generally refers to the beam emitted by the light source module. For heterodyne detection, the input beam can include components having slightly different frequencies, as discussed above.

While encoder scale 105 is depicted in FIG. 1 as a structure that is periodic in one direction, more generally, the measurement object can include a variety of different diffractive structures that appropriately diffract the measurement beam. In some embodiments, the measurement object can include a diffractive structure (e.g., a encoder scale) that is periodic in two directions (e.g., along the x- and y-axis), diffracting the measurement beam into beams in two orthogonal planes. In general, the diffractive structure of the encoder scale and source module are selected so that the encoder system provides one or more diffracted measurement beams having sufficient intensity to establish one or more detectable interference signals when combined with corresponding reference beams, within the geometrical constraints for the system. In some embodiments, the source module provides an input beam having a wavelength in a range from 400 nm to 1,500 nm. For example, the input beam can have a wavelength of about 633 nm or about 980 nm. Note that, in general, the frequency splitting of the heterodyne source results in only a very small difference between the wavelength of the two components of the input beam, so even though the input beam is not strictly monochromatic it remains practical to characterize the input beam by a single wavelength. In some embodiments, the source module can include a HeNe laser, a laser diode or other solid-state laser source, a light-emitting diode, or a thermal source such as a halogen light with or without a filter to modify the spectral bandwidth.

In general, the diffractive structure (e.g., grating pitch) can vary depending on the wavelength of the input beam and the arrangement of optical assembly and diffracted orders used for the measurement. In some embodiments, the diffractive structure is a grating having a pitch in a range from about $1\lambda$ to about $20\lambda$, where $\lambda$ is a wavelength of the source. The grating can have a pitch in a range from about 1 μm to about 10 μm.

Various embodiments of encoder systems are possible. For example, the measurement beam can be incident on measurement object 101 at an incident angle such that the diffracted measurement beam does not satisfy the Littrow condition. The Littrow condition refers to an orientation of a diffractive structure, such as a grating, with respect to an incident beam where the diffractive structure directs the diffracted beam back towards the source such that the diffracted beam is co-linear with the incident beam. When the diffracted beam is not co-linear with the incident beam, the Littrow condition is not satisfied.

In some embodiments, the encoder system is arranged so that the measurement beam makes a double pass to the encoder scale and a twice diffracted order of the measurement beam is used for the measurement. For example, referring to FIG. 2, an interferometric heterodyne optical encoder system 200 includes an optical assembly 210 having a reference retroreflector 212, a measurement retroreflector 214, and a polarizing beam-splitter 216. The system 200 also contains a target 201, a laser source 218, a detector module 240 including a detector 242 and polarizer 244, and an electronic processor 250. A Cartesian coordinate system is shown for reference.

Figure 2:
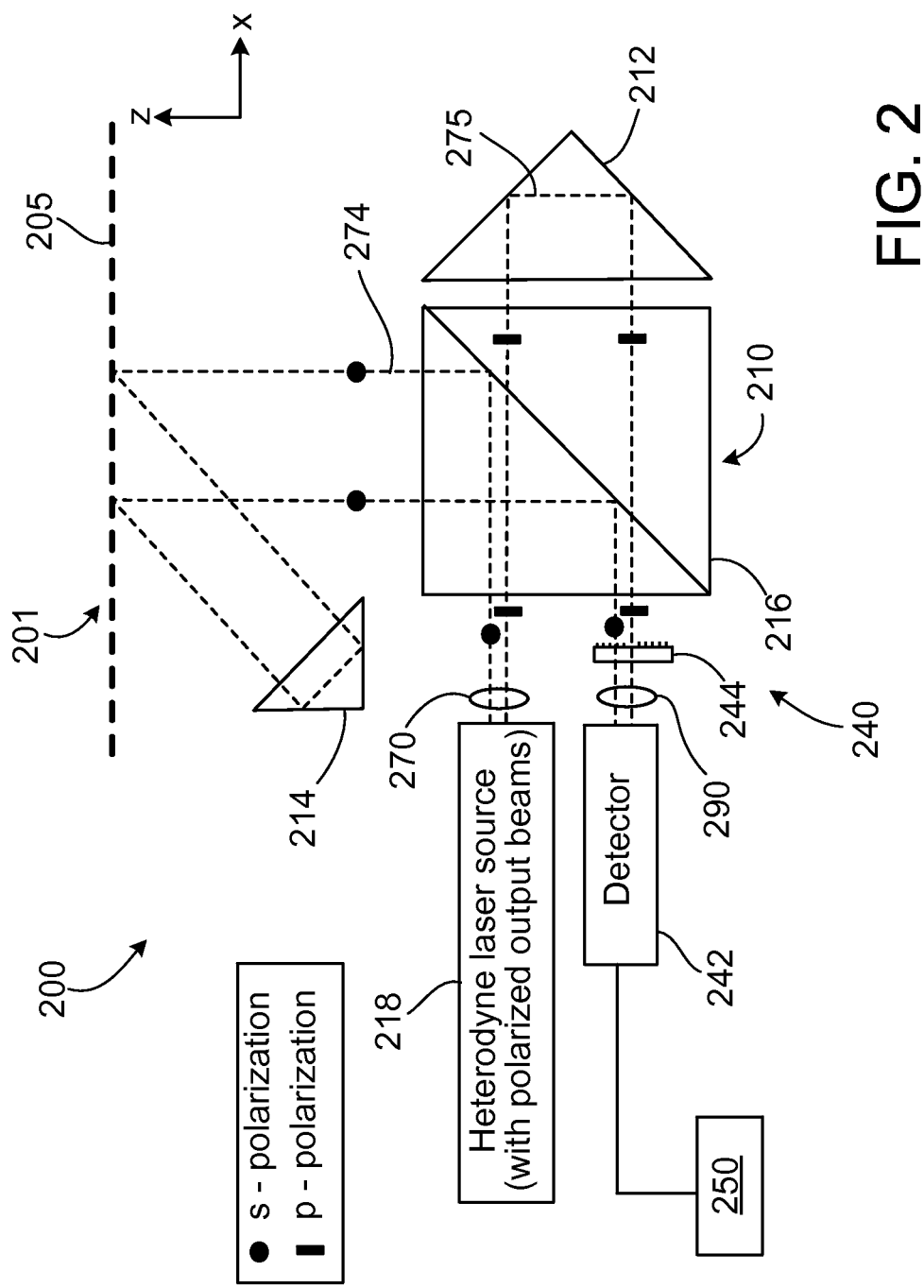
FIG. 2 is a schematic diagram of an embodiment of an interferometric heterodyne optical encoder.

To perform the monitoring, source 218 directs an input beam 270 to polarizing beam-splitter 216. Polarizing beam-splitter 216 derives a measurement beam 274 and a reference beam 275 from input beam 270, where the polarizations of the measurement beam 274 and reference beam 275 are orthogonal. As shown in the example of FIG. 2, measurement beam 274 is polarized orthogonal to the plane of the figure (s-polarization), while secondary beam 275 is polarized in the plane of the figure (p-polarization). However, the measurement beam and reference beam can have any polarization (e.g., linear, circular, or elliptical) as long as they are distinguishable from one another (e.g., orthogonally polarized).

The beam-splitter 216 directs the measurement beam 274 to target 201. Target 201 can include an encoder scale 205 that diffracts the incident measurement beam 274, providing a once-diffracted measurement beam that corresponds to a non-zeroth diffracted order (e.g., first order or second order) of measurement beam 274. The diffracted measurement beam 274 then is redirected by measurement retroreflector 212 to impinge on the encoder scale 205 once more to provide a twice-diffracted measurement beam. The twice-diffracted measurement beam 274 then returns to polarizing beam-splitter 216. The polarizing beam-splitter 216 then combines the twice-diffracted measurement beam 274 with the reference beam 275 to form an output beam 290, where the reference beam 275 has been redirected by the reference retroreflector 212. Although FIG. 2 shows a polarizing beam-splitter, other optical components may be used that also direct beams based on polarization properties. These optical components include, for example, prism cubes, diffractive optics, birefringent components and reflective surfaces (bare or coated) on which beams are incident at glancing angles.

The output beam 290 includes phase information related to the optical path difference between the component corresponding to the twice-diffracted measurement beam and the component corresponding to the reference beam. Polarizing beam-splitter 216 then directs output beam 290 to detector module 240. At detector module 240, polarizer 244 mixes the measurement and reference beam components of the output beam 290 before the output beam is incident on detector 242. This can be achieved, for example, by orienting the transmission axis of polarizer 244 so that it transmits a component of s-polarized light and a component of p-polarized light (e.g., by orienting the transmission axis at 45° with respect to the plane of the page). Upon detecting the mixed components of the output beam 290, the detector 242 of detector module 240 subsequently sends a signal to electronic processor 250 in response.

Electronic processor 250 receives and analyses the signal and determines information about one or more degrees of freedom of target 201 relative to the optical assembly 210. Specifically, the electronic processor determines this information based in part on a heterodyne phase of the signal. Accordingly, monitoring changes in the heterodyne frequency allows one to monitor motion of the target 201 relative to the optical assembly 210.

As shown in FIG. 2, the polarizing beam-splitter causes the separation of the measurement beam and reference beam components from the input beam. In some implementations, however, the separation of the measurement beam and the reference beam components may be imperfect, e.g., a portion of the measurement beam component does not follow the measurement beam path and/or a portion of the reference beam component does not follow the reference beam path, leading to beam "mixing."

In general, the spurious beams that mix with other desired beams are called "ghost beams." The ghost beams may have different amplitudes, different phase offsets, and/or different frequencies from the beams with which they combine, resulting in a shift in a detected interference signal frequency or phase, or a change in detected interference signal amplitude. As a result, cyclic errors in measurements of the position of the encoder scale can occur, in which the errors are periodic with the position of the encoder scale relative to the optical assembly.

Ghost beams can be caused by various imperfections in the interferometric encoder system. For example, unintended ellipticity in the polarizations of the different frequency components of the input beam may lead to leakage through a polarizing beam-splitter that is used to split the input beam along respective measurement and reference paths. That is to say, a portion of the measurement beam having a first polarization and frequency may exit the beam splitter along the reference path instead of the measurement path as intended, whereas a portion of the reference beam having a second different polarization and frequency may exit the beam splitter along the measurement path instead of the reference path as intended. In some embodiments, unintended elliptical polarization in the input beam is due to polarization mixing inherent in the illumination source. Leakage through a polarizing beam-splitter also may be caused by imperfections in the beam-splitter, itself. For example, in some embodiments, the polarizing beam-splitter may have a low extinction ratio, where the extinction ratio is the transmission of an unwanted beam component relative to the beam wanted component. In some embodiments, leakage through a polarizing beam splitter is due to misalignment of the input beam with the beam splitter's plane of polarization.

Ghost beams also can arise due to unwanted reflections from other components of the interferometric encoder system. For example, in some embodiments the interferometric encoder system employs one or more quarter wave plates. If the quarter wave plates do not enable 100% beam transmission, a portion of the beam incident on the wave plate may be unintentionally reflected into a measurement path or reference path.

In some embodiments, reflections from the encoder scale also lead to ghost beams. For example, a portion of the diffracted measurement beam may unintentionally propagate toward the beam-splitter along a path that is co-linear with the incident measurement beam (i.e., before diffraction from the encoder scale). It should be noted that the foregoing examples of sources of cyclic errors are not exhaustive and that other mechanisms for generating such errors also exist.

Interference of the desired beams and the ghost beams, whether from leakage or other imperfections in the interferometer system, can lead to various types of cyclic errors that cause deviations in the detected output beam. Electronic or algorithmic means can be applied to mitigate the cyclic errors that are produced as a result of the system imperfections. However, in some instances, the errors are too large, leading to significant uncertainty in the measurement results.

Angled-Beam Error Correction

Figure 3:
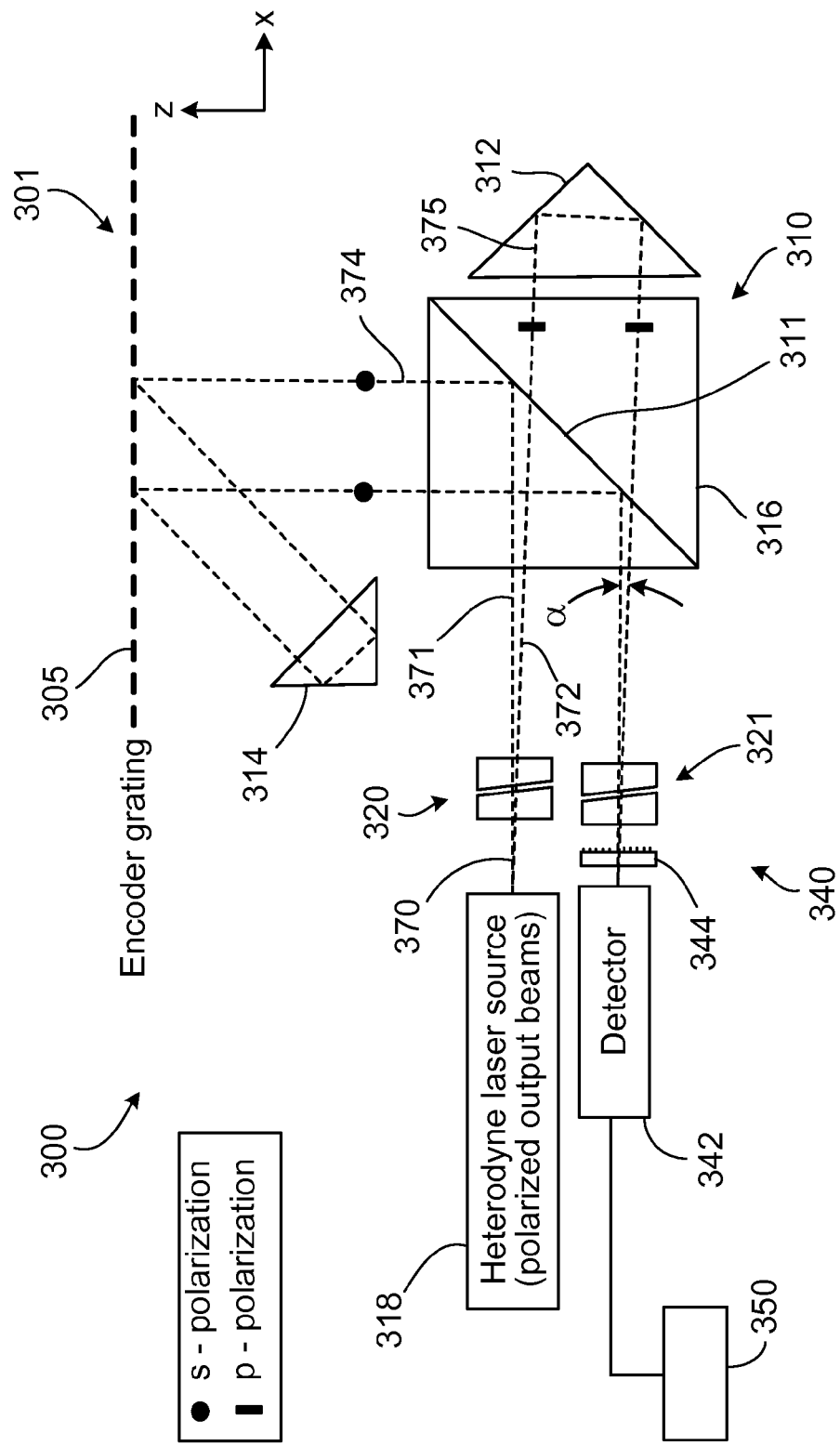
FIG. 3 is a schematic diagram of an embodiment of an interferometric heterodyne optical encoder system.

In some embodiments, cyclic errors can be minimized by increasing a separation angle between the measurement and reference beams. For example, FIG. 3 is a schematic diagram of a heterodyne optical encoder system 300 for suppressing non-linearities and cyclic errors, such as those caused by beam mixing. The basic operating principles of the encoder system 300 are similar to those of system 100 shown in FIG. 1. However, the encoder system 300 includes one or more polarization optics that introduce and remove a difference in propagation angle between measurement and reference beams to enhance separation between the beams. This allows the beams to be distinguished by their propagation angle in addition to their polarization, thus reducing the magnitude of cyclic errors produced by ghost beams and polarization mixing effects.

Similar to the interferometric encoder system of FIG. 2, system 300 includes a detector module 340 having a detector 342 and polarizer 344, a source 318, an electronic processor 350, a target 301 that includes an encoder scale 305, and an optical assembly 310 having a reference retroreflector 312, a measurement retroreflector 314, and a polarizing beam-splitter 316. The optical assembly 310 also includes a polarization optic 320, such as a birefringent component.

During operation of the system 300, laser source 318 produces an input beam 370 having co-linear, orthogonally polarized components defining a primary beam portion 371 and a secondary beam portion 372. For example, the primary beam portion can be linearly polarized out of the plane of the figure (e.g., s-polarization), whereas the secondary beam portion can be linearly polarized in the plane of the figure (e.g., p-polarization). The orthogonally polarized portions can further include a heterodyne frequency shift between them. It should be noted that the primary beam portion and secondary beam portions can have any polarization (e.g., linear, circular, or elliptical) as long as they are distinguishable from one another (e.g., orthogonally polarized).

The input beam 370 is incident on the first polarization optic 320. The polarization optic 320 imparts a small angle of separation α between the directions of propagation of the primary and secondary beam portions 371, 372. The amount of angular separation can be determined based on the initial beam polarization of the input beam 370, which may be defined by the laser source 318, as well as the material and orientation of the polarization optic 320, to be described further below. The respective polarization states of the primary and secondary beam components are generally preserved upon emerging from the polarization optic 320.

The primary beam 371 and secondary beam 372 then are further separated according to their polarizations by polarizing beam-splitter 316 to define measurement beam 374 and reference beam 375, respectively. A polarizing beam-splitter interface 311 redirects the measurement beam 374 along a measurement path toward a encoder scale 305 while simultaneously transmitting the reference beam 375 along a reference path toward reference retroreflector 312. The measurement beam 374 is diffracted into one or more diffracted orders by the encoder scale 305 located on target 301. In preferred embodiments, the diffracted measurement beam then propagates along a direction away from polarizing beam-splitter 316 toward measurement retroreflector 314 where the diffracted beams is redirected back to the encoder scale 305. The measurement beam 374 then diffracts again from the encoder scale 305 and returns to the polarizing beam-splitter 310. At the same time, the reference beam 375 is redirected by reference retroreflector 312 back towards the polarizing beam-splitter 316.

The twice-diffracted measurement beam 374 then is reflected by the polarizing beam-splitter interface 311 while the reference beam 375 is transmitted through the interface 311. Due to the angular separation of the input beam 370 initially imparted by the first polarization optic 320, however, the twice-diffracted measurement beam 374 and the reference beam 375 do not travel along parallel paths toward the detector 342. Instead, the beam paths of the twice-diffracted measurement beam 374 and reference beam 375 exiting the beam-splitter 316 propagate with an angle of separation α between the beam paths.

The converging beams are incident on a second polarization optic 321 (e.g., a birefringent component) that removes the angle of separation between the twice-diffracted measurement beam path and the reference beam path. As a result, the measurement beam 374 and reference beam 375 transmit through the second polarization optic 321 and propagate co-linearly as an output beam. Polarizer 344 mixes the co-linear beams. The mixed beams are detected by detector 342, which produces an interference signal. The detector 342 subsequently sends the interference signal to electronic processor 350.

However, beams without the proper polarization and/or the proper propagation angle including, for example, ghost beams will not be transmitted co-linearly through the second polarization optic 321. Instead, those spurious beams are deflected by the second polarization optic 321 away from the detector.

Electronic processor 350 receives and analyzes the heterodyne frequency of the interference signal to determine information about one or more degrees of freedom of target 301 relative to the encoder system 300. Similar to the encoder system 200 shown in FIG. 2, changes in the heterodyne frequency correspond to changes in the velocity of the target 301 through well-known Doppler relations. In contrast to the encoder system 200, however, the non-parallelism of spurious beams exiting the second polarization optic 321 suppresses the contribution of those beams to the interferometric measurement. Accordingly, in some implementations, the motion of the target 301 relative to the encoder system 300 can be monitored and cyclic errors due to beam mixing can be reduced.

In the example of FIG. 3, each of the first polarization optic 320 and the second polarization optic 321 can include a birefringent component such as a birefringent prism pair. For example, a first prism in the pair can include a birefringent wedge prism and a second prism in the pair can include an isotropic wedge prism. In some embodiments, the birefringent wedge and isotropic wedge can be fused together (e.g., using an optical adhesive) to form a single composite birefringent component. The wedge materials and orientations can be selected so that a first beam having a selected polarization transmits through the birefringent component without any angular deflection, whereas a second beam having a polarization orthogonal to the first beam is angularly deflected by the birefringent component. For example, the isotropic prism may be formed from any of the common optical glasses, such as BK7 or fused silica. The birefringent prism may be formed of one or more different materials, such as crystalline quartz $SiO_2$, rutile $TiO_2$, sapphire $Al_2O_3$, lithium niobate $LiNbO_3$, calcite $CaCO_3$. The prism pair may also be of two different birefringent materials with different crystalline orientation or degrees of birefringence. Although the birefringent components shown in FIG. 3 each include a prism pair, the component can include a single prism, three prisms or some other combination of prisms.

The angular separation imparted by the polarization optic 320 can be between about 0.05 mrad and 20 mrad, including for example, between about 0.1 and 10 mrad, or between about 0.5 and 5 mrad.

In some embodiments, it is not necessary to use two separate polarization optics. Instead, a single polarization optic, such as a single birefringent prism pair, can be used to impart the angular separation to the orthogonally polarized portions of the input beam and also remove the angular separation from the diffracted measurement beam and reference beam that exit the polarizing beam-splitter.

Figure 4:
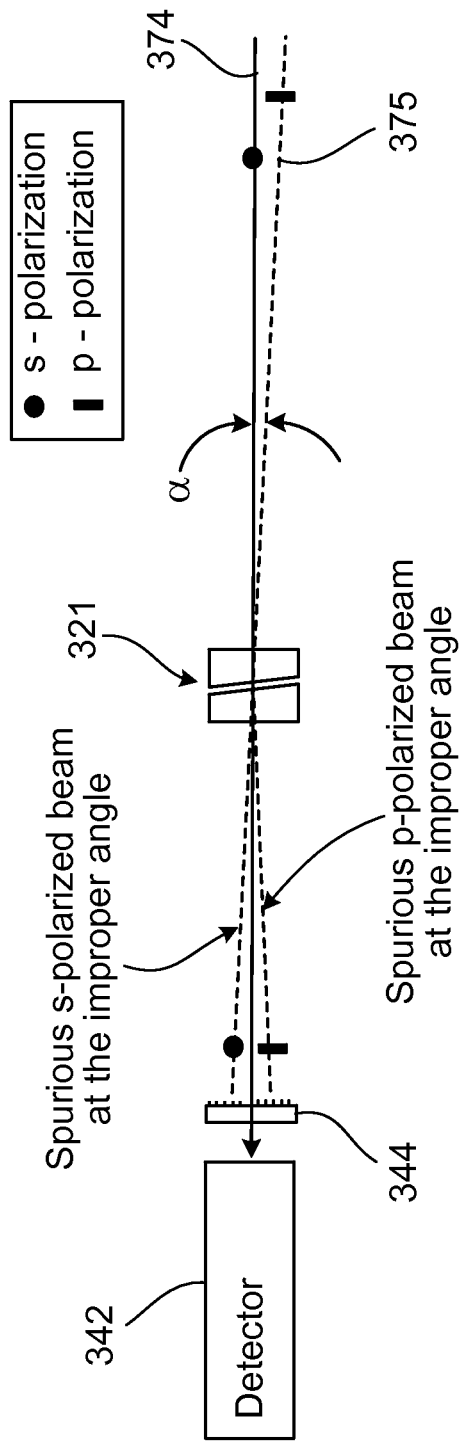
FIG. 4 is a schematic diagram illustrating an expanded portion of the encoder system of FIG. 3.

FIG. 4 is a schematic diagram illustrating an expanded portion of the encoder system 300 of FIG. 3 during operation of the system 300. In particular, FIG. 4 shows the measurement beam 374 and reference beam 375 as they exit the polarizing beam-splitter 316 and propagate towards detector 342. In the absence of beam-mixing or ghost beams, the measurement beam 374 (which has, for example, s-polarization) and the reference beam (which has, for example, p-polarization) approach the birefringent component 321 at an angle of convergence equal to the angle of separation α. The birefringent component 321 then removes the angle of separation so that both beams propagate co-linearly toward polarizer 344 and detector 342.

In contrast, if the beams incident on the birefringent component 321 are ghost beams (e.g., beams that inadvertently transmit through or reflect from the polarizing beam-splitter due to an imperfect beam-splitter interface or due to imperfect polarization), that propagate towards the birefringent component 321 with an improper angle, such ghost beams are deflected upon passing through the birefringent component 321 and propagate away from the detector as spurious polarized beams. For example, referring to FIG. 3, if an incorrectly polarized beam propagates parallel to beam 374, the incorrectly polarized beam will exit the birefringent component 321 as a spurious p-polarized beam. Similarly, if an incorrectly polarized beam propagates parallel to beam 375, the incorrectly polarized beam will exit the birefringent component 321 as a spurious s-polarized beam. The angle between the two spurious beams is approximately twice the angle of separation α.

Although the spurious beams may still pass through the polarizer 344 and onto the detector 342 even after deflection by the component 321, the spurious beams do not significantly alter the primary interference signal produced by the measurement beam and reference beam. Instead, the optical interference signal produced by the spurious beams averages away when integrated over the spatial extent of the detector given that the spurious components diverge from the compensated output beam 390 and from each other. For example, the spurious beams may generate a fringe pattern on the detector surface that, when integrated across the detector surface, results in a weak contamination signal. If desired, the spurious beams may also be removed by spatial filtering (not shown in FIG. 3). In contrast, when the measurement beam and reference beam having the proper propagation angle and polarization transmit co-linearly to the detector after passing through the output component 321, the heterodyne interference signal produced by the beams has a strong contrast (i.e., ratio of signal modulation to average signal value).

Figure 5A:
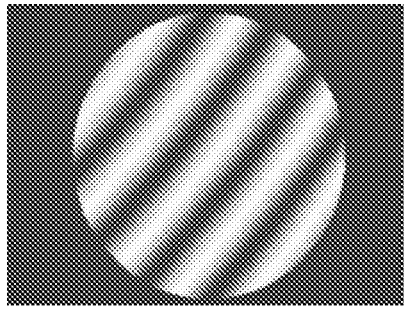
FIG. 5A is an example image of an interference pattern obtained from an interferometric heterodyne optical encoder system.
Figure 5C:
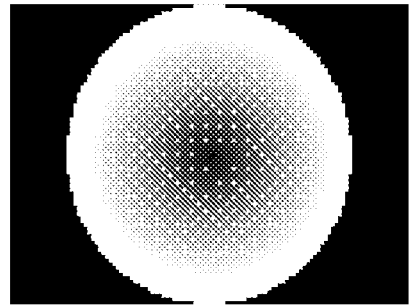
FIG. 5C is an example image of an interference pattern obtained from an interferometric heterodyne optical encoder system.
Figure 5B:
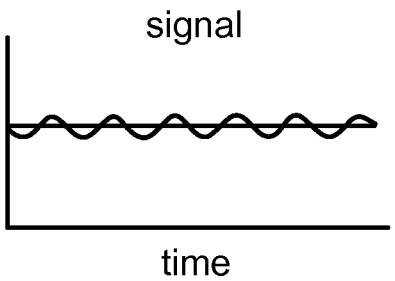
FIG. 5B is a graph of an integrated intensity value of the interference pattern of FIG. 5A.
Figure 5D:
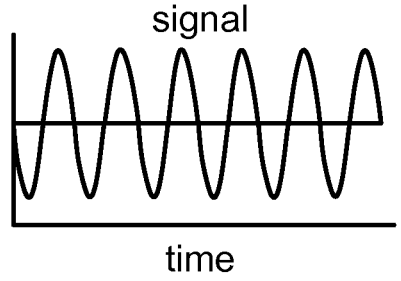
FIG. 5D is a graph of an integrated intensity value of the interference pattern of FIG. 5C.

FIG. 5A is an example image of a simulated interference pattern based on the interference between two beams having a non-zero separation angle between them (e.g., non-co-linear spurious beams). The simulation was produced using MATHCAD® 14 simulation software. FIG. 5B is a graph depicting the integrated intensity value of the interference pattern of FIG. 5A integrated over the detector surface versus time. In contrast, FIG. 5C is an example image of a simulated interference pattern based on the interference between two beams having no angle of separation between them (e.g., co-linear measurement and reference beams). The beams are modeled as uniform in intensity. In practice, the beams typically will have a more Gaussian intensity profile. FIG. 5D is a graph depicting the integrated intensity value of the interference pattern of FIG. 5C integrated over the detector surface versus time. As shown in the examples of FIG. 5, integration of the interference pattern from the spurious beams corresponds to a signal with relatively low magnitude whereas the magnitude of the integrated interference signal of the measurement and reference beams is much greater.

To determine the degree to which unwanted spurious signals are attenuated, the total number of fringes ν across the detector area is determined. In an example, it is assumed that the detector area is circular, such that the number of fringes is given by the following equation:

$$\nu = \frac{4R}{\lambda}\sin(\alpha), \tag{1}$$

where R is the detector radius, λ is the wavelength, α is the divergence angle between the interfering beams. Next, the heterodyne signal, which is the real part of the complex representation, is calculated. For simplicity, it is assumed that the beam profile is perfectly flat across the detector aperture (though in practice the beam profile may vary), such that a complex representation of the heterodyne signal can be expressed as:

$$I(t,\nu,x) = \exp[i(ft + \pi\nu x/R)], \tag{2}$$

where f is the heterodyne frequency, x is a linear coordinate orthogonal to the interference fringes, and the signal strength has been normalized to 1. The total signal is the integration over the entire detector area is provided by the equation $$I(t, \nu) = \frac{1}{\text{area}} \int_{\text{area}} I(t, \nu, x) da. \tag{3}$$

In polar coordinates (r, θ), Eq. 3 becomes $$I(t, \nu) = \frac{1}{\pi R^2} \int_0^R \int_0^\pi I[t, \nu, x(r, \theta)] d\theta r dr, \tag{4}$$

where $$x(r, \theta) = r \cos(\theta). \tag{5}$$

Incorporating Eq. 1, Eq. 5 then becomes $$I(t, \nu) = \left\{ \frac{2}{\pi R^2} \int_0^R \int_0^\pi \exp[i(r\pi\nu/R)\cos(\theta)] d\theta r dr \right\} \exp(ift). \tag{6}$$

Using

-continued $$J_0(u') = \frac{1}{\pi} \int_0^\pi \exp[iu' \cos(\theta)] d\theta \qquad (7)$$

$$uJ_1(u) = \int_0^u u' J_0(u') du' \qquad (8)$$

with $$u' = (r\pi v/R) \qquad (9)$$

$$u = \pi v, \qquad (10)$$

the heterodyne signal can be expressed as:

$$I(t, v) = \left[\frac{2J_1(\pi v)}{\pi v}\right] \exp(ift). \qquad (11)$$

The integrated signal strength may therefore be proportional to $$S(v) = \left|\frac{2J_1(\pi v)}{R}\right|. \qquad (12)$$

Figure 6:
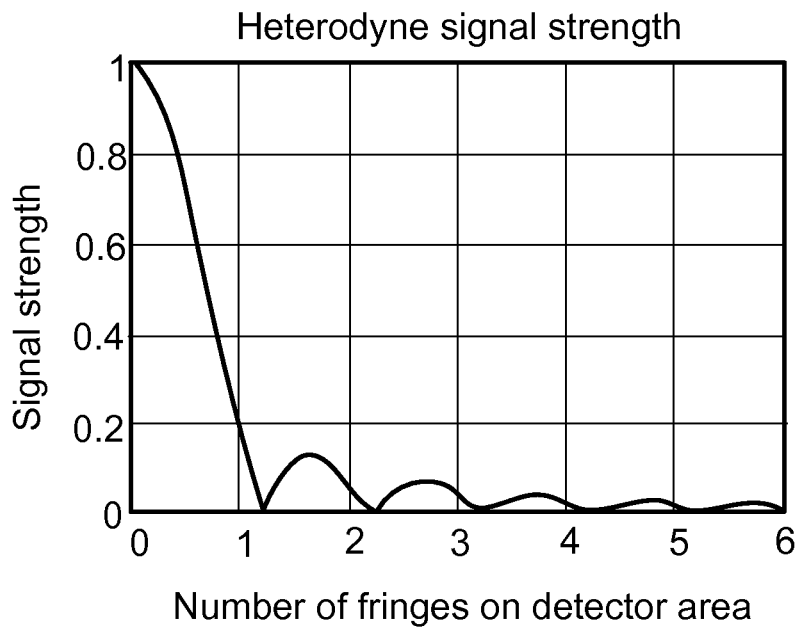
FIG. 6 is a graph of the integrated signal strength versus number of fringes recorded by a detector.

A graph of the simulated integrated signal strength versus number of fringes recorded across a detector diameter is shown in FIG. 6. As shown in FIG. 6, it is evident that beams having a small relative divergence, and thus low number of fringes (see Eq. 1) will contribute strongly to the heterodyne signal. As an example, if the detector area is a circle of radius R=0.5 mm and the beam profile is uniform over this area, then according to Eq. (1), a divergence angle as small as α=1 mrad at a wavelength λ=633 nm will generate 3.16 fringes across the field of view. The resulting contribution to the signal is only 0.0125 compared to a maximum of 1 for co-linear beams. Although the exact quantitative calculation may be different for different beam profiles (e.g., Gaussian beam profiles), the basic principle set forth above applies.

Other configurations of the interferometric heterodyne optical encoder system are also possible. For example, in some embodiments, the interferometric heterodyne optical encoder system incorporates two separate detector modules, each of which separately interferes and detects different diffracted orders with a reference beam to both improve motion sensitivity resolution and distinguish between encoder motion along a primary beam axis and a secondary axis.

Figure 7:
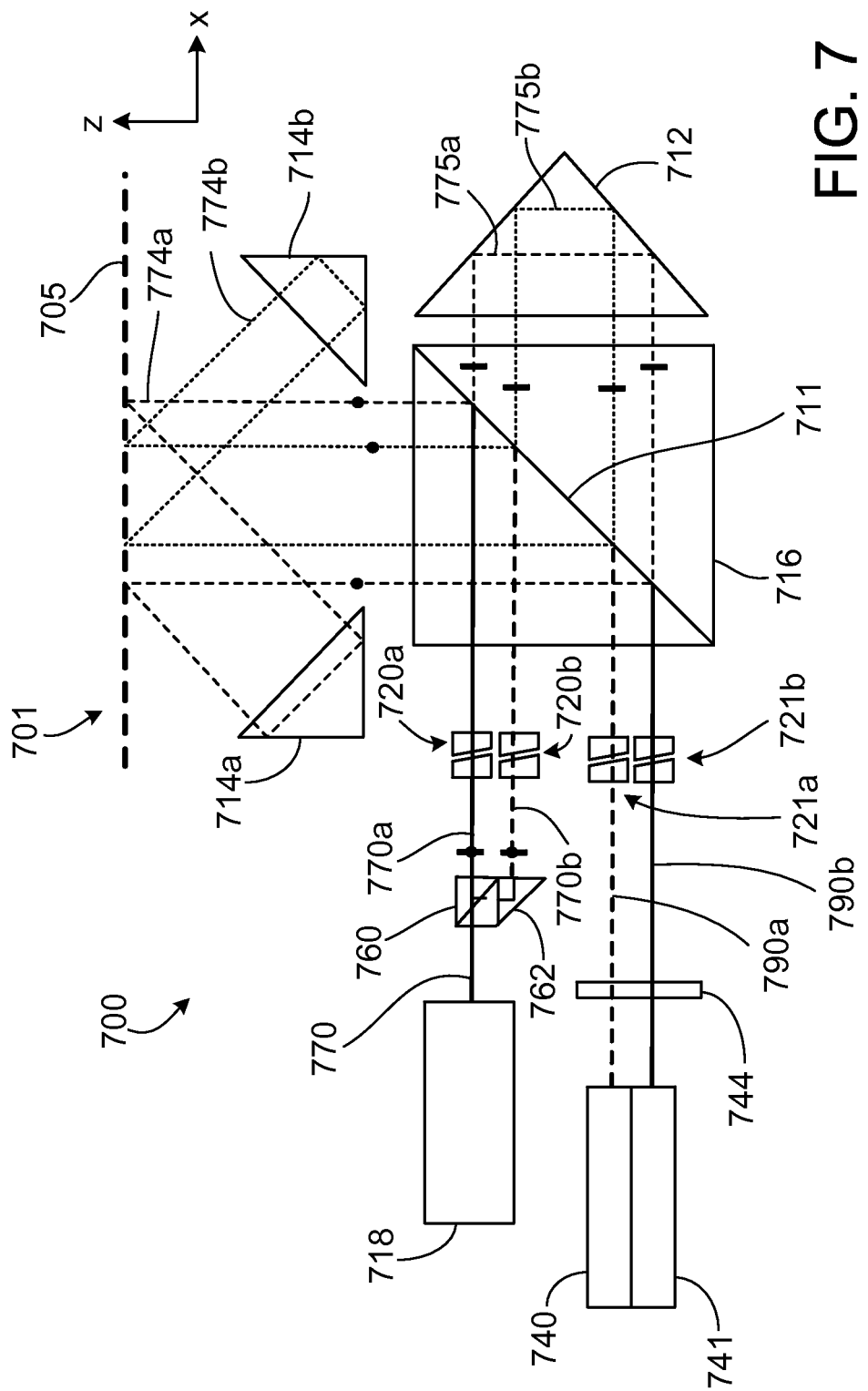
FIG. 7 is a schematic diagram of an embodiment of an interferometric heterodyne optical encoder system.

For example, FIG. 7 is a schematic diagram of an encoder system 700 that employs two separate detectors 740, 741. In the example of FIG. 7, laser source 718 produces an input beam 770 having co-linear, orthogonally polarized components. The input beam 770 is incident on a non-polarizing beam splitter 760, where the beam 770 is separated into separate input beams 770a (solid line in FIG. 7) and 770b (dotted line in FIG. 7). The non-polarizing beam-splitter 760 can also include a retroreflector 762 arranged to redirect at least one of the beams 770a, 770b so both beams propagate co-linearly toward the polarizing beam-splitter 716.

Prior to reaching beam-splitter 716 each input beam passes through a corresponding polarization optic that imparts an angular separation to the orthogonally polarized portions of the beams. As shown in the example of FIG. 7, polarization optic 720a imparts a first angle of separation α₁ (not shown) to the s- and p-polarized portions of input beam 770a to derive a first measurement beam 774a and first reference beam 775a. Similarly, polarization optic 720b imparts a second angle of separation α₂ (not shown) to the s- and p-polarized portions of input beam 770b to derive a second measurement beam 774b and second reference beam 775b.

Both measurement beams are subsequently re-directed by the beam-splitter interface 711 toward a target 701 having an encoder scale 705. In the present example, encoder scale 705 diffracts each of the incident measurement beams 774a, 774b into one or more diffracted orders. At least one of the diffracted orders from measurement beam 774a is redirected by first measurement retroreflector 714a back to the encoder scale 705. Similarly, at least one of the diffracted orders from the second measurement beam 774b is redirected by second measurement retroreflector 714b back to the encoder scale 705. Both diffracted orders then are diffracted again back toward the polarizing beam-splitter 716. In addition, both reference beams are transmitted through the beam-splitter interface 711 toward the reference retroreflector 712 where they are redirected back to the beam-splitter 716. Upon exiting beam-splitter 716, twice-diffracted measurement beam 774a and reference beam 775a converge towards polarization optic 721a with an angle of separation α₁ (not shown). Similarly, twice-diffracted measurement beam 774b and reference beam 775b converge towards polarization optic 721b with an angle of separation α₂ (not shown).

Each polarization optic subsequently removes the angle of separation between the corresponding twice-diffracted measurement beam/reference beam pair to provide either a first output beam 790a or second output beam 790b. Polarizer 744 then mixes the co-linear and orthogonal portions of output beam 790a to produce a first interference pattern and mixes the co-linear and orthogonal portions of 790b to produce a second interference pattern, in which the first interference pattern and the second interference pattern are detected by detector 740 and detector 741 respectively. The detectors 740, 741 then each produce an interference signal that is sent to the processor 750. Although a single polarizer 744 is shown in the example of FIG. 7, a separate polarizer can be provided for each output beam 790a and 790b.

Spurious beams without the proper polarization and/or the proper propagation angle, however, will not be transmitted co-linearly through the polarization optics 721a, 721b. Instead, those spurious beams are deflected by the polarization optics 721a, 721b away from the detectors.

Electronic processor 750 receives and analyzes the heterodyne frequency of the interference signals. Since motion of the encoder scale in the Z direction is common to the measurements of both detector modules, while motion of the encoder scale along the X direction is detected with opposite signs, the motion along the X and Z directions can be distinguished by a composite signal consisting of the sum or difference of the two separate phases for each interference signal. In some embodiments, additional detector modules can be provided for measurement of the displacements along the Y-axis. For such 2-dimensional (2D) applications (X and Y measurements) an area grating can be used. For example, encoder scale 705 can be periodic in both the X- and Y-directions.

As in other embodiments, each of the first polarization optics, 720a and 720b, can include a birefringent component, such as a birefringent prism pair, where a first prism in the pair is a birefringent wedge and a second prism in the pair is an isotropic wedge. The birefringent wedge and isotropic wedge can be separate components or fused together (e.g., using an optical adhesive) to form a single composite birefringent component. The wedge materials and orientations can be selected so that a first beam having a selected polarization transmits through the birefringent component without any angular deflection, whereas a second beam having a polarization orthogonal to the first beam is angularly deflected by the birefringent component. In some embodiments, a single polarization optic, such as a single birefringent prism pair, can be used to impart the angle of separation to the orthogonally polarized portions of each input beam and also remove the angles of separation from the diffracted measurement beams and reference beams that exit the polarizing beamsplitter.

Figure 8:
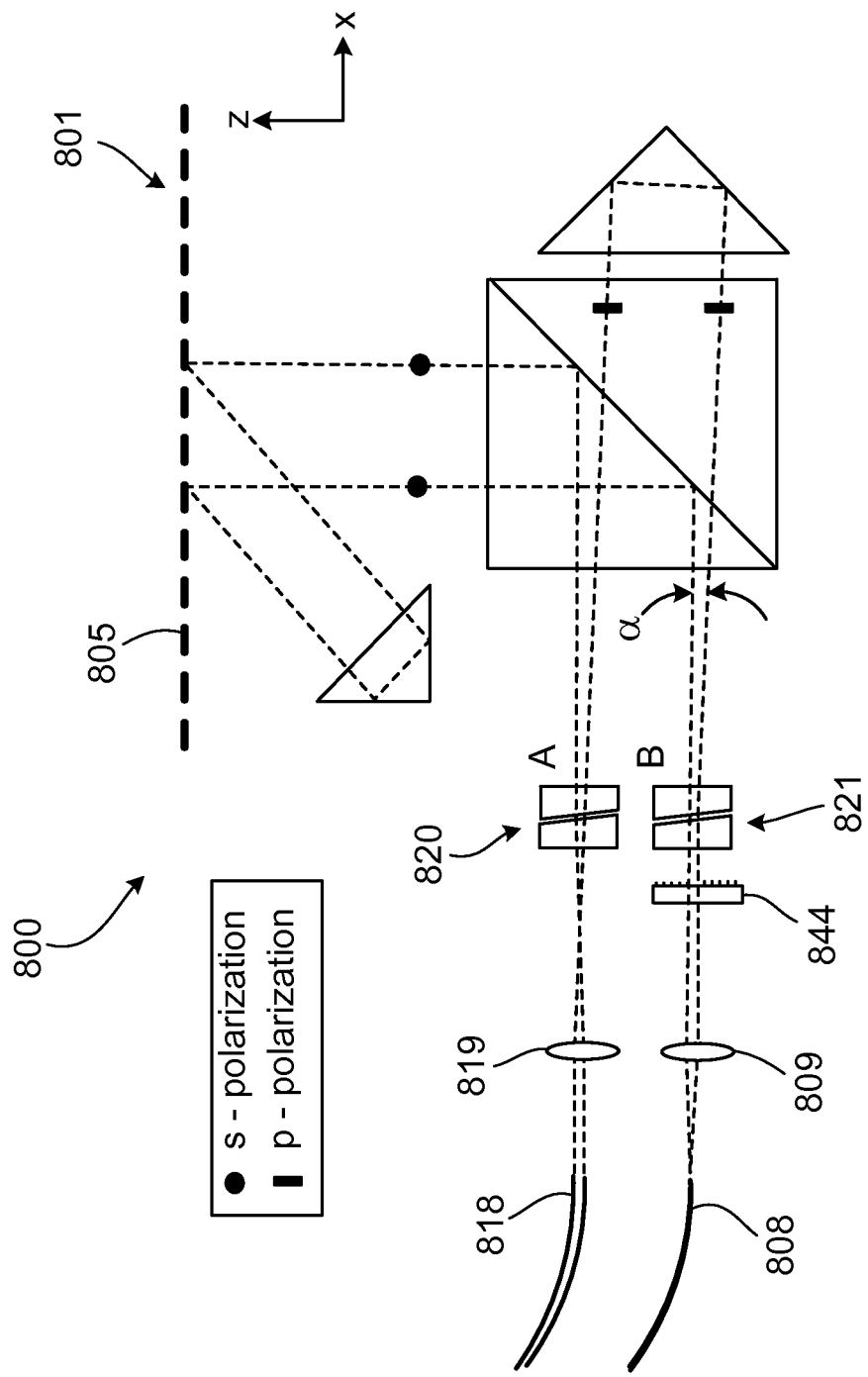
FIG. 8 is a schematic diagram of an embodiment of an interferometric heterodyne optical encoder system.

In some embodiments, optical fibers are used in place of the free-space light source input. For example, FIG. 8 is a schematic diagram of an exemplary interferometric heterodyne optical encoder system 800 that includes a dual fiber input 818 and a fiber output 808. In the example, the fiber input 818 is a polarization preserving fiber that includes a first fiber core and a second separate fiber core. The first fiber core is arranged to provide a first beam having a first polarization whereas the second fiber core is arranged to provide a second beam having a second orthogonal polarization.

The polarization optic 820 (e.g., a birefringent prism pair having a birefringent prism A and glass prism B) operates in combination with a focusing lens 819 to impart an angle of separation to the orthogonally polarized input beams. In contrast, the polarization optic 821 (e.g., a second birefringent prism pair) operates to remove an angle of separation between a diffracted measurement beam and reference beam, and to deflect spurious beams away from fiber output 808. The lens 809 can be used to couple an interference signal into the fiber output 808, where the interference signal is obtained by mixing the diffracted measurement beam and reference beam at polarizer 844. Other components of encoder system 800 are similar to those described above with respect to system 300 and/or system 700.

Figure 9:
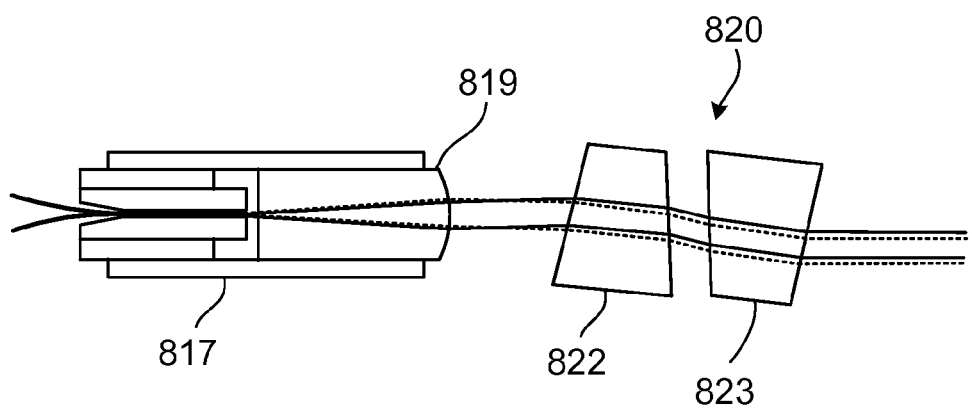
FIG. 9 is a schematic diagram of a beam delivery portion of the system of FIG. 8.

FIG. 9 is a schematic diagram that shows the beam delivery portion of the example system 800 in more detail. As shown in the example of FIG. 9, lens 819 is incorporated at the end of the input fiber pigtail 817. The polarization optic 820 includes a birefringent prism 822 and a glass prism 823. The two fiber cores of the dual fiber input 818 can be separated by various distances including, but not limited to between about 75 μm to 175 μm, between about 100 μm to 150 μm or between about 125 μm to 135 μm. Lens 819 can have various focal lengths depending on the collimated beam widths desired. For example, the focal length of lens 819 can be approximately 7.0 mm for a beam having a width of 1.25 mm at $1/e^2$ of the maximum collimated beam intensity, resulting in an initial angular separation of the measurement beam from the reference beam of about 1.023° to 1.105°. Other angles of separation can be imparted to the beams. For example, the input fiber optic lens 819 and the input polarization optic 820 can combine to cause the angular difference in propagation direction between the first and second beams to be between about 0.1 and 10 mrad, or between about 0.5 and 5 mrad.

Figure 10:
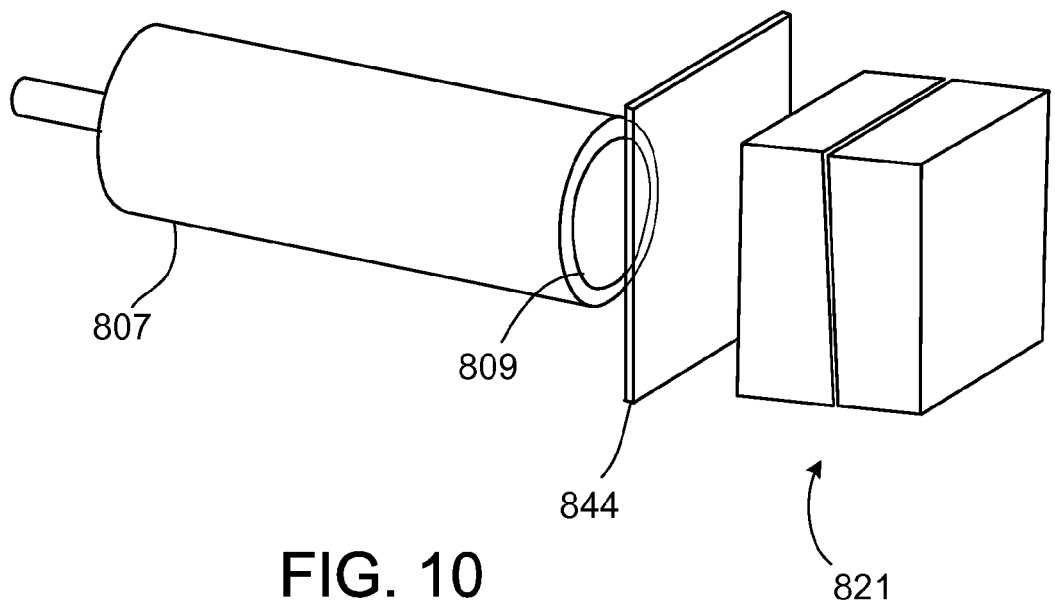
FIG. 10 is a schematic diagram of a fiber output portion of the system of FIG. 8.

FIG. 10 is a schematic diagram that shows the fiber output portion of FIG. 8 including polarization optic 821 and polarizer 844. As shown in the example, lens 809 is incorporated at the end of the output fiber pigtail 807. In some implementations, the polarization optic 821, which can include a birefringent prism and isotropic prism, reduces the angular separation between a diffracted measurement beam and a reference beam to 1 mrad or 2 fringes across the $1/e^2$ beam diameter. In some implementations, the foregoing reduction is sufficient to substantially reduce sources of cyclic error.

In general, any of the analysis methods described above, including determining information about a degree of freedom of the encoder scales, can be implemented in computer hardware or software, or a combination of both. For example, in some embodiments, the electronic processors can be installed in a computer and connected to one or more encoder systems and configured to perform analysis of signals from the encoder systems. Analysis can be implemented in computer programs using standard programming techniques following the methods described herein. Program code is applied to input data (e.g., interferometric phase information) to perform the functions described herein and generate output information (e.g., degree of freedom information). The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

Lithography Tool Applications

Lithography tools are especially useful in lithography applications used in fabricating large scale integrated circuits such as computer chips and the like. Lithography is the key technology driver for the semiconductor manufacturing industry. Overlay improvement is one of the five most difficult challenges down to and below 22 nm line widths (design rules), see, for example, the *International Technology Roadmap for Semiconductors*, pp. 58-59 (2009). See also M. S. Hibbs, "System overview of optical steppers and scanners," Microlithography, K. Suzuki, B. Smith, Eds., pp. 46-47 (CRC Press, Boca Raton, 2007).

Overlay depends directly on the performance, i.e., accuracy and precision, of the metrology system used to position the wafer and reticle (or mask) stages. Since a lithography tool may produce $50-100M/year of product, the economic value from improved metrology systems is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer. In certain lithography tools, e.g., lithography scanners, the mask is also positioned on a translatable stage that is moved in concert with the wafer during exposure.

Encoder systems, such as those discussed previously, are important components of the positioning mechanisms that control the position of the wafer and reticle, and register the reticle image on the wafer. If such encoder systems include the features described above, the accuracy of distances measured by the systems can be increased and/or maintained over longer periods without offline maintenance, resulting in higher throughput due to increased yields and less tool downtime.

In general, the lithography tool, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Encoder systems described above can be used to precisely measure the positions of each of the wafer stage and mask stage relative to other components of the exposure system, such as the lens assembly, radiation source, or support structure. In such cases, the encoder system's optical assembly can be attached to a stationary structure and the encoder scale attached to a movable element such as one of the mask and wafer stages. Alternatively, the situation can be reversed, with the optical assembly attached to a movable object and the encoder scale attached to a stationary object.

More generally, such encoder systems can be used to measure the position of any one component of the exposure system relative to any other component of the exposure system, in which the optical assembly is attached to, or supported by, one of the components and the encoder scale is attached, or is supported by the other of the components.

Figure 11:
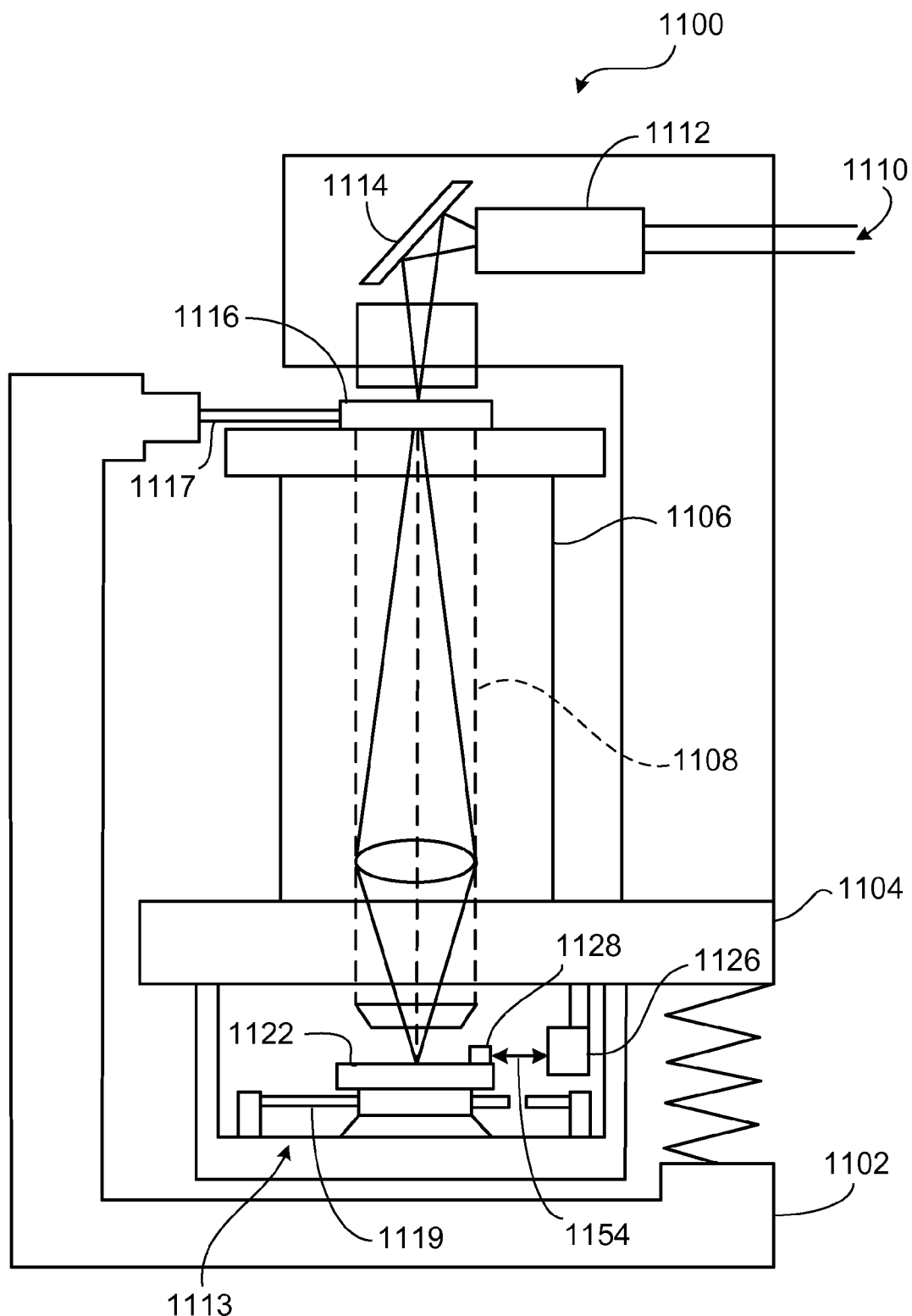
FIG. 11 is a schematic diagram of an embodiment of a lithography tool that includes an interferometer.

An example of a lithography tool 1100 using an interferometric encoder system 1126 is shown in FIG. 11. The interferometric encoder system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the encoder systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a measurement object 1128 for diffracting a measurement beam 1154 directed to the stage by optical assembly 1126. A positioning system for positioning stage 1122 relative to optical assembly 1126 is indicated schematically by element 1119. Positioning system 1119 can include, e.g., piezoelectric transducer elements and corresponding control electronics. The measurement object diffracts the measurement beam back to the optical assembly, which is mounted on exposure base 1104. The interferometric encoder system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In some embodiments, one or more of the encoder systems described previously can be used to measure displacement along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In certain embodiments, the optical assembly 1126 can be positioned to measure changes in the position of reticle (or mask) stage 1116 or other movable components of the scanner system. Finally, the encoder systems can be used in a similar fashion with lithography systems involving steppers, in addition to, or rather than, scanners.

Figure 12A:
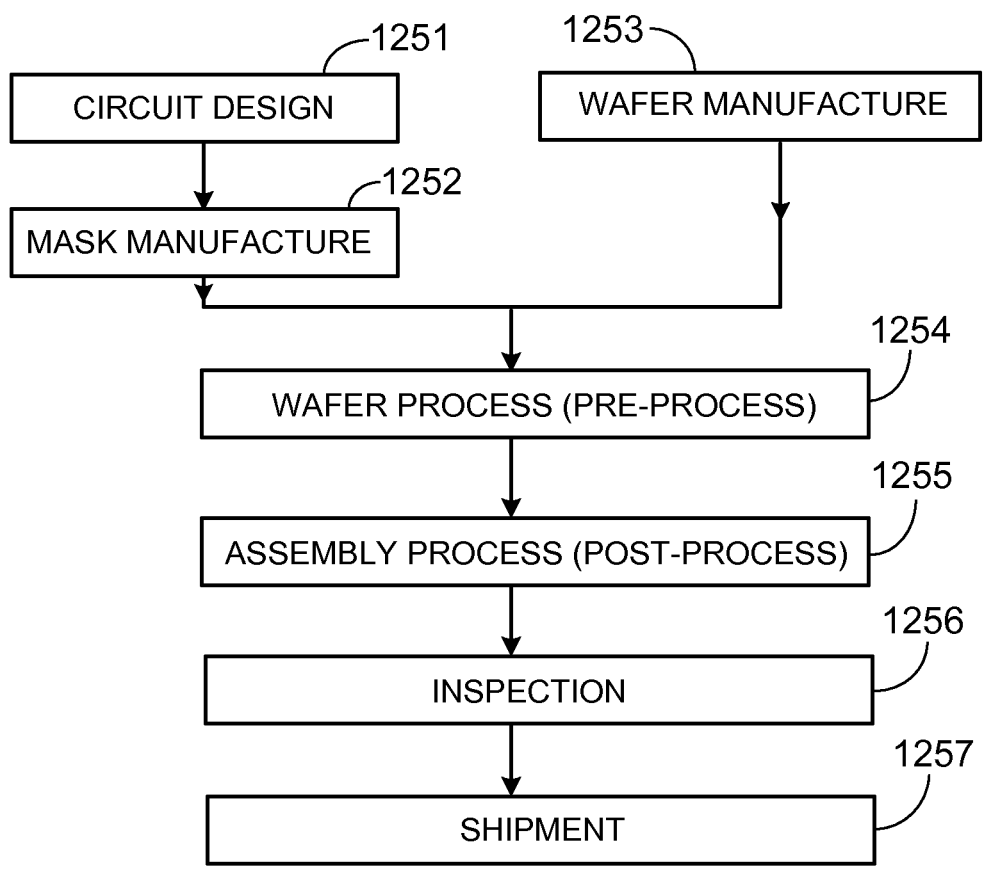
FIG. 12A and FIG. 12B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 12A and 12B. FIG. 12A is a flow chart of the sequence of manufacturing a semiconductor device such as a semiconductor chip (e.g., IC or LSI), a liquid crystal panel or a CCD. Step 1251 is a design process for designing the circuit of a semiconductor device. Step 1252 is a process for manufacturing a mask on the basis of the circuit pattern design. Step 1253 is a process for manufacturing a wafer by using a material such as silicon.

Step 1254 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1255 is an assembling step, which is called a post-process wherein the wafer processed by step 1254 is formed into semiconductor chips. This step includes assembling (dicing and bonding) and packaging (chip sealing). Step 1256 is an inspection step wherein operability check, durability check and so on of the semiconductor devices produced by step 1255 are carried out. With these processes, semiconductor devices are finished and they are shipped (step 1257).

Figure 12B:
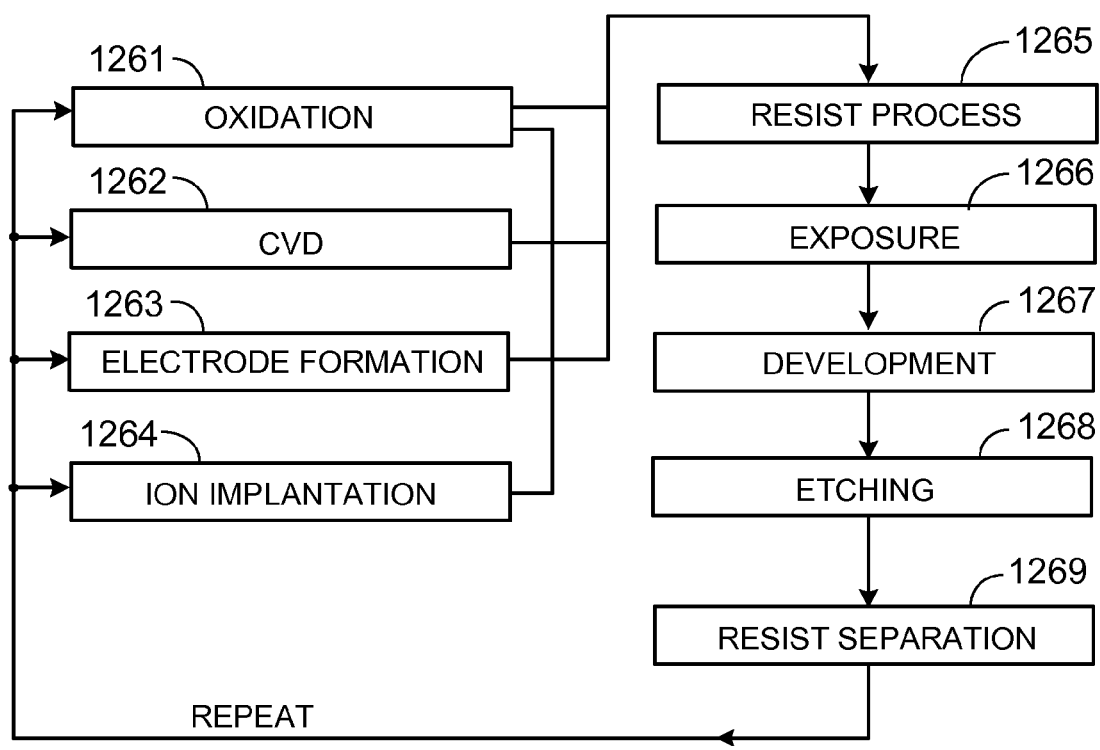

FIG. 12B is a flow chart showing details of the wafer process. Step 1261 is an oxidation process for oxidizing the surface of a wafer. Step 1262 is a CVD process for forming an insulating film on the wafer surface. Step 1263 is an electrode forming process for forming electrodes on the wafer by vapor deposition. Step 1264 is an ion implanting process for implanting ions to the wafer. Step 1265 is a resist process for applying a resist (photosensitive material) to the wafer. Step 1266 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1267 is a developing process for developing the exposed wafer. Step 1268 is an etching process for removing portions other than the developed resist image. Step 1269 is a resist separation process for separating the resist material remaining on the wafer after being subjected to the etching process. By repeating these processes, circuit patterns are formed and superimposed on the wafer.

The encoder systems described above can also be used in other applications in which the relative position of an object needs to be measured precisely. For example, in applications in which a write beam such as a laser, x-ray, ion, or electron beam, marks a pattern onto a substrate as either the substrate or beam moves, the encoder systems can be used to measure the relative movement between the substrate and write beam.

Other embodiments are within the scope of the following claims.

What is claimed is:

1. An encoder interferometry system comprising:
a beam splitting element positioned to receive an input beam from a light source, wherein the beam splitting element is configured to direct a first portion of the input beam along a measurement path to define a measurement beam and a second portion of the input beam along a reference path to define a reference beam;
an encoder scale positioned to diffract the measurement beam at least once;
one or more optical components configured and arranged to alter a direction of a first diffracted portion of the measurement beam and a direction of a second diffracted portion of the measurement beam such that beam paths of the first diffracted portion and the second diffracted portion are non-parallel subsequent to the first diffracted portion and the second diffracted portion passing through the beam splitting element; and
a detector positioned to receive the first diffracted portion of the measurement beam.

2. The encoder interferometry system of claim 1, wherein the one or more optical components are configured and arranged to cause the first diffracted portion and the second diffracted portion to diverge from one another after the first diffracted portion and the second diffracted portion pass through the beam splitting element.

3. The encoder interferometry system of claim 1, wherein the one or more optical components are configured and arranged to cause the second diffracted portion to follow a beam path away from the detector after the second diffracted portion passes through the beam splitting element.

4. The encoder interferometry system of claim 1, wherein the one or more optical components comprise a birefringent optical component.

5. The encoder interferometry system of claim 4, wherein the birefringent component comprises a birefringent wedge-shaped prism.

6. The encoder interferometry system of claim 1, further comprising an optical fiber coupled to the detector.

7. The encoder interferometry system of claim 6, further comprising a polarizer and a focusing lens each arranged along the optical beam path of the first diffracted portion, wherein the polarizer is arranged between the focusing lens and the beam splitting element.

8. The encoder interferometry system of claim 7, wherein the focusing lens is arranged between an input face of the optical fiber and the polarizer, and wherein the focusing lens is positioned to receive the first diffracted portion from the polarizer.

9. A method comprising:
receiving an input beam from a light source;
directing a first portion of the input beam along a measurement path toward an encoder scale to define a measurement beam and a second portion of the input beam along a reference path to define a reference beam;
receiving, at one or more optical components, a first portion of the measurement beam that has been diffracted by the encoder scale and a second portion of the measurement beam that has been diffracted by the encoder scale, wherein the one or more optical components alters a direction of the first diffracted portion and a direction of the second diffracted portion such that the beam paths of the first diffracted portion and the second diffracted portion are non-parallel subsequent to the first diffracted portion and the second diffracted portion passing through the beam splitting element;
receiving, at a detector, the first diffracted portion.

10. The method of claim 9, wherein the one or more optical components alters the direction of the first diffracted portion and a direction of the second diffracted portion such that the first diffracted portion and the second diffracted portion diverge from one another after the first diffracted portion and the second diffracted portion pass through the beam splitting element.

11. The method of claim 9, wherein the one or more optical components alters the direction of the first diffracted portion and a direction of the second diffracted portion such that the second diffracted portion follows a beam path away from the detector after the second diffracted portion passes through the beam splitting element.

12. The method of claim 9, further comprising directing the first diffracted portion toward a polarizer positioned in front of the detector.

13. The method of claim 12, further comprising directing the first diffracted portion toward a focusing lens positioned between the polarizer and the detector.

* * * * *